United States Patent [19]
Iwasaki

[11] Patent Number: 5,128,626
[45] Date of Patent: Jul. 7, 1992

[54] COHERENTLY DEMODULATING ARRANGEMENT INCLUDING QUASI-COHERENT DEMODULATOR FOR PSK SIGNALS

[75] Inventor: Motoya Iwasaki, Tokyo, Japan

[73] Assignee: NEC Corporation, Tokyo, Japan

[21] Appl. No.: 705,747

[22] Filed: May 28, 1991

Related U.S. Application Data

[63] Continuation-in-part of Ser. No. 418,502, Oct. 10, 1989, abandoned.

[30] Foreign Application Priority Data

Oct. 7, 1988 [JP] Japan .................................. 63-253344

[51] Int. Cl.$^5$ .............................................. H04L 27/22
[52] U.S. Cl. ..................................... 329/307; 329/325; 329/346; 375/81
[58] Field of Search ................ 329/302, 306–309, 329/325, 326, 346, 360; 375/81, 120; 455/260, 264, 265

[56] References Cited

U.S. PATENT DOCUMENTS 3,371,281  2/1968  Powell ............................. 329/325 X

*Primary Examiner*—Siegfried H. Grimm
*Attorney, Agent, or Firm*—Laff, Whitesel, Conte & Saret

[57] ABSTRACT

An arrangement for coherently demodulating PSK (phase-shift keying) signals, includes a quasi-coherent demodulator which implements coarse coherent demodulation on an incoming PSK-modulated IF signal using a variable frequency which is applied from a controllable local oscillator. The output of the quasi-coherent demodulator is applied to a coherent demodulator which also receives the output of a VCO (Voltage Controlled Oscillator). A phase detector receives the output of the coherent demodulator and applies the output thereof to the VCO via a loop filter. The output of the loop filter is applied to a local oscillator controller having an output which is used to control the controllable local oscillator.

5 Claims, 4 Drawing Sheets

COHERENTLY DEMODULATING ARRANGEMENT INCLUDING QUASI-COHERENT DEMODULATOR FOR PSK SIGNALS

RELATED APPLICATION

This application is a continuation-in-part application of U.S. patent application Ser. No. 07/418,502 filed Oct. 10, 1989, now abandoned.

BACKGROUND OF THE INVENTION

1. Field of the Invention

This invention relates generally to a coherent demodulating arrangement for use in a digital radio communications system, and more specifically to such a demodulating arrangement by which a high quality baseband signal can be obtained even if a modulated incoming signal deviates in frequency. This invention is directed to an arrangement for demodulating the signals which have been PSK modulated.

2. Description of the Prior Art

As is known in the art, coherent demodulating arrangements are used to detect a baseband signal through multiplication of a modulated incoming IF (Intermediate Frequency) signal and a reproduced carrier signal. The reproduction of a carrier signal is implemented by a phase-locked loop using a demodulated baseband signal.

Before describing the present invention in detail, reference will be made to two known coherent demodulating arrangements with reference to FIGS. 1 and 2, respectively.

In FIG. 1, an incoming modulated IF signal is applied via an input terminal 10 to a non-coherent demodulator 12, which is coupled to a local oscillator 14 via a phase shifter 11 and a signal distributer 13. The phase shifter 11 shifts, by $\pi/2$ radians, the phase of the output of the local oscillator 14 applied to the non-coherent demodulator 12. The frequency of the output of the oscillator 14 is previously set to the frequency of the incoming modulated IF signal. The term "non-coherent" in this specification implies that there exists no frequency or phase synchronization between the local oscillator 14 and the received IF signal. The output of the non-coherent demodulator 12 is, in most cases, not equal to a baseband signal but is similar thereto, and is applied to a coherent demodulator 16. The coherent demodulator 16 forms part of a phase-locked loop 18 which, in addition to the coherent demodulator 16, comprises a channel filter 20, a phase detector 22, a loop filter 24 and a voltage controlled oscillator (VCO) 26. As shown, the VCO 26 is coupled to the coherent demodulator 16 via a signal distributor 23 and a phase shifter 25. These blocks 23, 25 exhibit the same functions as the blocks 11, 13, respectively. The two lines between the blocks 12, 16 are provided for signals having complex values, that is having a real part and an imaginary part. This applies to the two lines between the blocks 16, 20 and also between the blocks 20, 22. A phase-locked loop is itself well known in the art and hence the details thereof will not be described for brevity.

The coherent demodulator 16 receives a reproduced carrier wave from the VCO 26 and performs multiplication between the output of the unit 12 and the reproduced carrier wave. The output of the coherent demodulator 16 takes the form of a baseband signal which is applied to the phase detector 22 via the channel filter 20 which in this case exhibits a low-pass characteristics. The output of the coherent demodulator shown in FIG. 1, takes the form of a signal having a complex value and is derived from the channel filter 20. Since the coherent demodulator 16 precedes the channel filter 20, there is no degradation of signal wave even in the case of frequency deviation of incoming IF signal due to doppler shift in a satellite communications system, for example. However, the FIG. 1 arrangement has encountered the problem that the frequency response of the phase-locked loop 18 is undesirably lowered due to delay of signal transmission in the channel filter 20.

In order to overcome this problem, a second prior art demodulating arrangement, shown in FIG. 2, has been proposed. The arrangement of FIG. 2 is basically identical to that of FIG. 1 and differs only in that the coherent demodulator 16 is preceded by the channel filter 20. This overcomes the aforesaid lowering of the response of the phase-locked loop. However, since the frequency of the local oscillator 14 is fixed to that of the incoming IF signal, when a frequency deviation occurs in the incoming IF signal, the output of the non-coherent demodulator 12 is apt to contain frequency components which are out of the passband of the filter 20. This induces the situation wherein the wave shape of the output signal of the channel filter 20 is degraded and causes intersymbol interference. As a result, the prior art shown in FIG. 2 cannot be relied upon to provide high quality demodulated signals under all circumstances.

It should be noted that it would be possible for the local oscillator frequency to be equal to the frequency of the incoming IF signal although such a case is rare with a satellite communications system (for example). In which case, the VCO 26 terminates oscillation if the output of demodulator 12 (viz., baseband signal) continues to be applied to the demodulator 16 together with a reproduced carrier from the VCO 26. That is to say, the output of the VCO 26 becomes a direct current signal. Hence, the coherent demodulator 16 no longer functions as a demodulator. In other words, the circuit operates as if the output of the demodulator 12 is directly connected to the channel filter (FIG. 1) or to the phase detector 22 via the channel filter (FIG. 2).

SUMMARY OF THE INVENTION

It is an object of this invention to provide an improved coherent demodulating arrangement which is free of slow phase-locked loop response.

It is another object of this invention to provide an improved coherent demodulating arrangement which is free of intersymbol interference which occurs as a result of channel filter wave shaping degradation even if an incoming modulated IF signal deviates in frequency.

It is another object of this invention to provide an improved coherent demodulating arrangement which features high quality baseband signal demodulation regardless of frequency deviation in an incoming modulated IF signal.

These objects are fulfilled by an arrangement for coherently demodulating PSK (phase-shift keying) signals. The arrangement includes a quasi-coherent demodulator which implements coarse coherent demodulation on an incoming PSK-modulated IF signal using a variable frequency which is applied from a controllable local oscillator. The output of the quasi-coherent demodulator is applied to a coherent demodulator which also receives the output of a VCO (Voltage Controlled Oscillator). A phase detector receives the output of the coherent demodulator and applies the output thereof to the VCO via a loop filter. The output of the loop filter is applied to a local oscillator controller having an output which is used to control the controllable local oscillator.

One aspect of this invention takes the form of an arrangement for coherently demodulating an incoming IF signal in a digital radio communications system, the arrangement comprising: a local oscillator, the local oscillator having a controllable output frequency; a quasi-coherent demodulator coupled to receive the incoming IF signal and the output of the local oscillator; a channel filter coupled to receive the output of the quasi-coherent demodulator; a coherent demodulator coupled to receive the output of the channel filter and a reproduced carrier, the coherent demodulator outputting a baseband signal; a phase detector coupled to the coherent demodulator for detecting a phase difference between the baseband signal and the reproduced carrier; a loop filter coupled to receive the output of the phase detector; a voltage controlled oscillator coupled to receive the output of the loop filter and to generate the reproduced carrier which is applied to the coherent demodulator; and a local oscillator controller coupled between the loop filter and the local oscillator.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

Figure 1:
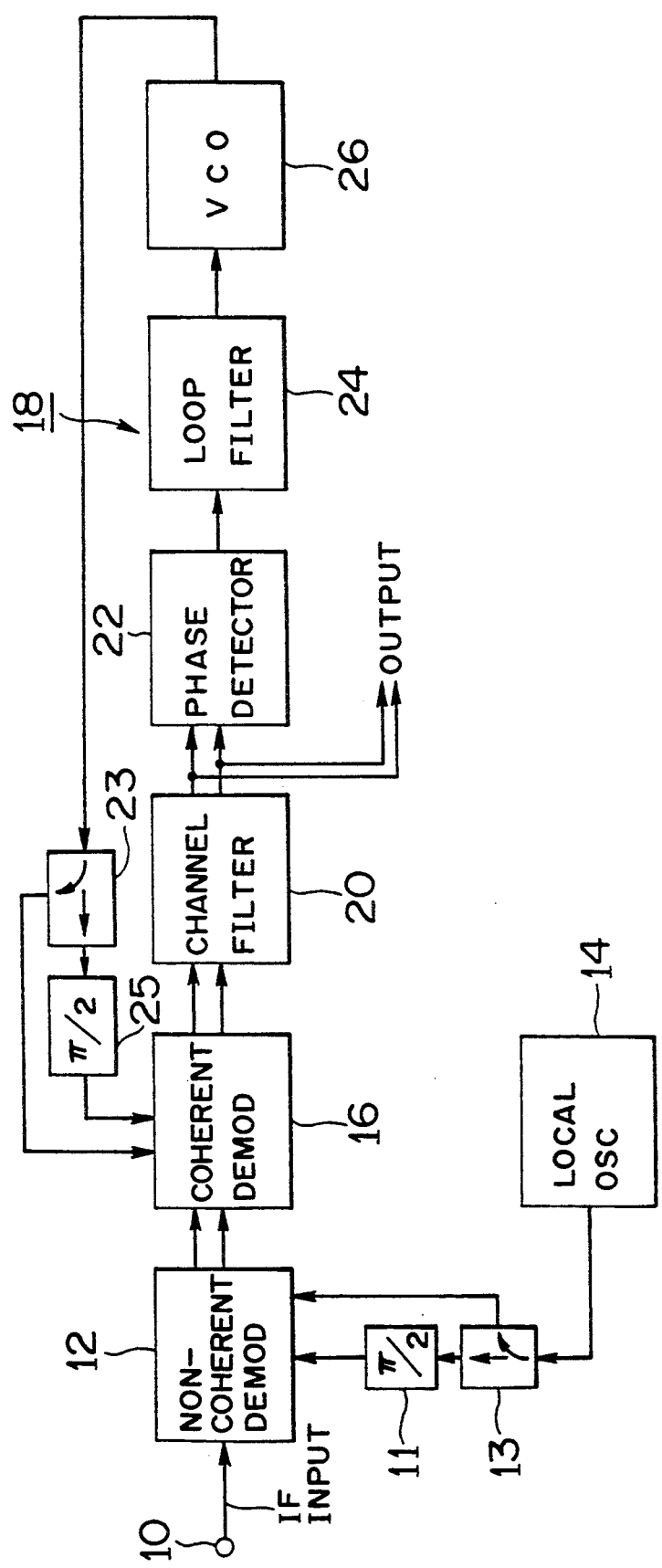
FIG. 1 shows in block diagram form the first prior art coherent demodulating arrangement discussed in the opening paragraph of the instant disclosure.
Figure 2:
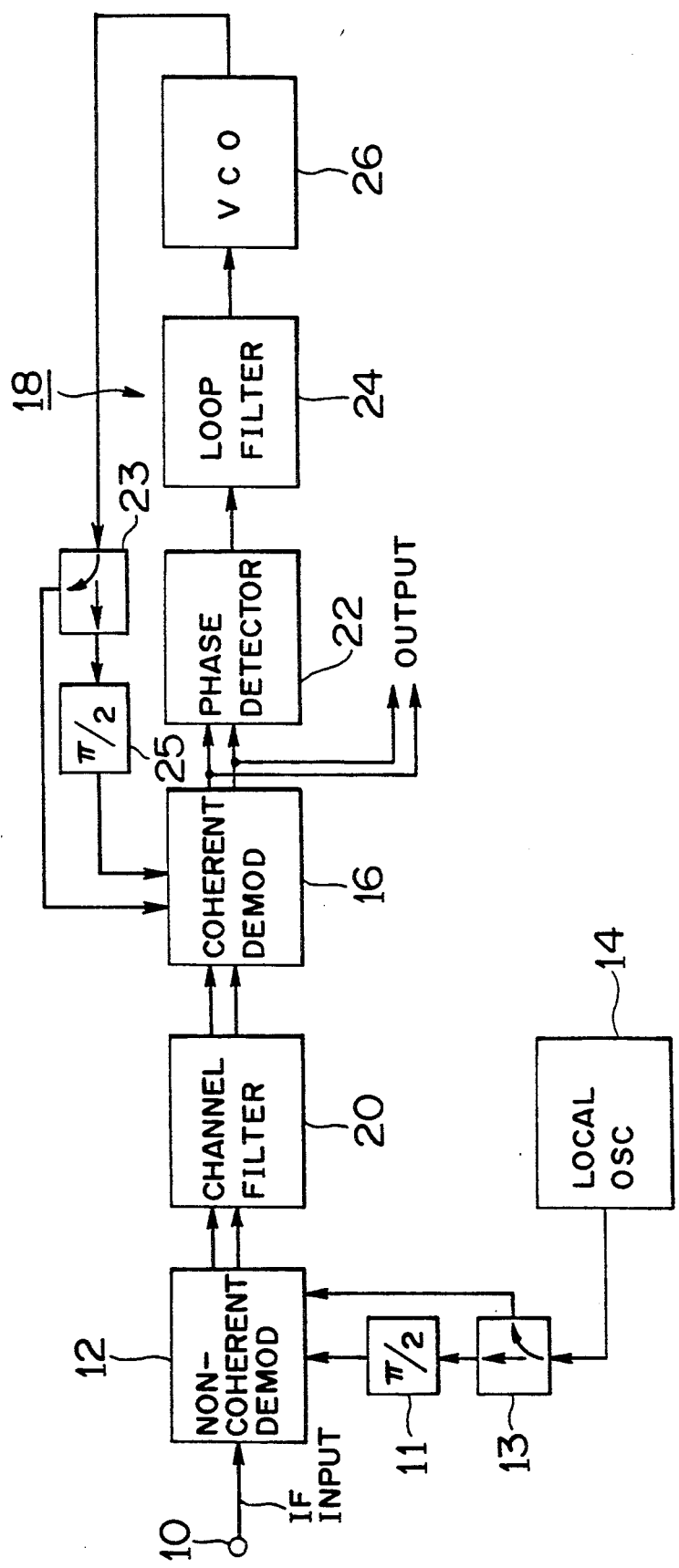
FIG. 2 shows the second of the prior art demodulating arrangements discussed above.
Figure 3:
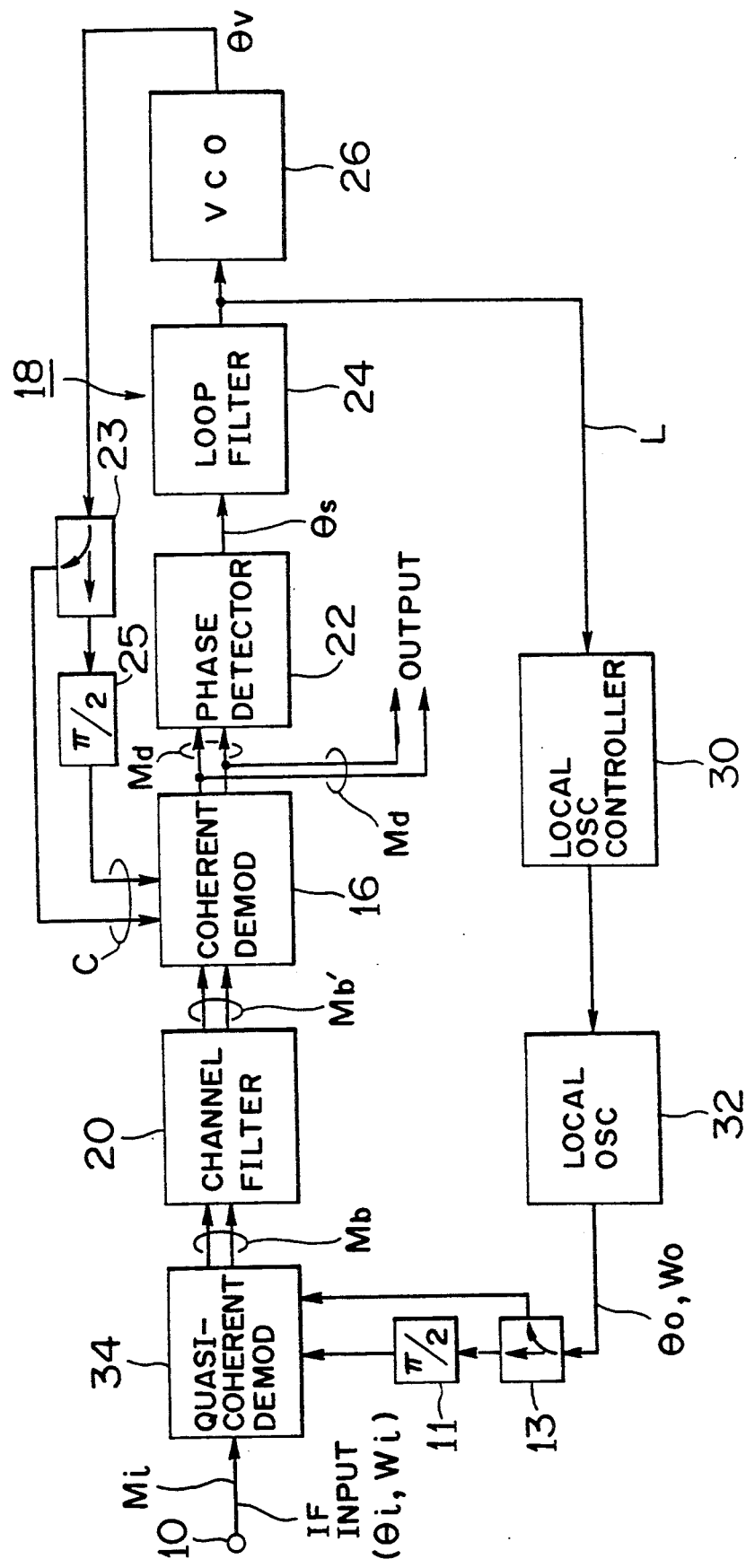
FIG. 3 is a block diagram showing a first embodiment of this invention.

Reference is made to FIG. 3 which illustrates the first embodiment of this invention. In brief, the difference between the arrangements of FIGS. 2 and 3 comes in that the latter arrangement is provided with a controllable local oscillator 32 whose output frequency is varied by a local oscillator controller 30, and in that the output of the local oscillator 32 is applied to a quasi-coherent demodulator 34.

The first embodiment will be discussed in more detail with reference to FIG. 3.

In FIG. 3, the incoming modulated IF signal (phase angle: $\theta i$, angular frequency: $Wi$) is applied via the input terminal 10 to the quasi-coherent demodulator 34, which also receives the output of the local oscillator 32 (phase angle: $\theta o$, angular frequency: $Wo$). It should be noted that the frequency of the output of the oscillator 32 is controlled to fall within a predetermined frequency range whose center frequency coincides with a nominal frequency of the incoming IF signal. In other words, the frequency of the output of the oscillator 32 is controlled such that the difference between the angular frequencies $Wi$ and $Wo$ is within a predetermined range defined by $\pm Rw$. The functions of the units 30, 32 and 34 will be described in more detail later. The output of the quasi-coherent demodulator 34 is, in most cases, not exactly equal to a baseband signal but is similar thereto, and is applied to the coherent demodulator 16 via the channel filter 20.

It is assumed that the incoming IF signal (denoted by Mi) is represented by $$\begin{aligned} Mi &= I\cos(Wit + \theta i) + Q\sin(Wit + \theta i) \\ &= \tfrac{1}{2} \cdot [I(e^{j(Wit+\theta i)} + e^{-j(Wit+\theta i)}) \\ &\quad - jQ(e^{j(Wit+\theta i)} - e^{-j(Wit+\theta i)})] \end{aligned} \quad (1)$$

where $$I = \pm 1 \text{ and } Q = \pm 1$$

The signal applied to the quasi-coherent demodulator 34 from the local oscillator 32 can be represented by $$e^{j(Wot+\theta o)}.$$

Accordingly, the output of the demodulator 34 (denoted by Mb) is $$\begin{aligned} Mb &= Mi \cdot e^{j(Wot+\theta o)} \\ &= \tfrac{1}{2} \cdot [I(e^{j(Wit+Wot+\theta i+\theta o)} + \\ &\quad e^{-j(Wbt+(\theta i-\theta o))}) - \\ &\quad jQ(e^{j(Wit+Wot+\theta i+\theta o)} - \\ &\quad e^{-j(Wbt+(\theta i-\theta o))})] \end{aligned} \quad (2)$$

where $$Wb = Wi - Wo$$

The channel filter (viz., low-pass filter) 20 is supplied with the signal Mb and blocks the high frequency component including ($Wit + Wot$), and, hence the output of the filter 20 (denoted by Mb') becomes as follows.

$$Mb' = \tfrac{1}{2} \cdot [I + jQ] e^{-j(Wbt+(\theta i-\theta o))} \quad (3)$$

Designating ($\theta i - \theta o$) by $\theta b$, then equation (3) is rewritten as follows.

$$Mb' = \tfrac{1}{2} \cdot [I + jQ] e^{-j(Wbt+\theta b)} \quad (4)$$

Designating the signal applied to the coherent demodulator 16 from the VCO 26 by $C = e^{j(Wbt+\theta v)}$, then the output of the coherent demodulator (denoted by Md) becomes $$\begin{aligned} Md &= Mb' \cdot C \\ &= \tfrac{1}{2} \cdot [I + jQ] e^{j(\theta v - \theta b)} \end{aligned} \quad (5)$$

Designating ($\theta v - \theta b$) by $\theta$, we obtain $$\begin{aligned} Md &= \tfrac{1}{2} \cdot [I + jQ] e^{j\theta} \\ &= \tfrac{1}{2} \cdot (I\cos\theta + Q\sin\theta) + j/2 \cdot (-I\sin\theta + Q\cos\theta) \\ &\quad I' + jQ' \end{aligned}$$

where $$I' = \tfrac{1}{2} \cdot (I \cos\theta + Q \sin\theta)$$

$$Q' = \tfrac{1}{2} \cdot (-I \sin\theta + Q \cos\theta) \tag{6}$$

The phase detector 22 is supplied with the output of the coherent demodulator 16 (viz., Mb) and detects a phase difference $\theta s$ which is represented by $$\theta s = I' \operatorname{sgn}(Q') - Q' \operatorname{sgn}(I') \tag{7}$$

where sgn( ) is the hard-limiting operation.

Accordingly, $$\operatorname{sgn}(I') = \begin{matrix} I(-\pi/4 + 2n\pi < \theta < \pi/4 + 2n\pi) \\ Q(\pi/4 + 2n\pi < \theta < 3\pi/4 + 2n\pi) \\ -I(3\pi/4 + 2n\pi < \theta < 5\pi/4 + 2n\pi) \\ -Q(5\pi/4 + 2n\pi < \theta < 7\pi/4 + 2n\pi) \end{matrix} \tag{8}$$

$$\operatorname{sgn}(Q') = \begin{matrix} Q(-\pi/4 + 2n\pi < \theta < \pi/4 + 2n\pi) \\ I(\pi/4 + 2n\pi < \theta < 3\pi/4 + 2n\pi) \\ -Q(3\pi/4 + 2n\pi < \theta < 5\pi/4 + 2n\pi) \\ -I(5\pi/4 + 2n\pi < \theta < 7\pi/4 + 2n\pi) \end{matrix} \tag{9}$$

Therefore, when $-\pi/4 + 2n\pi < \theta < \pi/4 + 2n\pi$, $$\begin{aligned} \theta s &= \tfrac{1}{2} \cdot [I\cos\theta + Q\sin\theta)Q - (-I\sin\theta + Q\cos\theta)I] \\ &= \tfrac{1}{2} \cdot (Q^2 + I^2)\sin\theta \\ &= \sin\theta \end{aligned} \tag{10}$$

Similarly, when $\pi/4 + 2n\pi < \theta < 3\pi/4 + 2n\pi$)

$$\begin{aligned} \theta s &= \tfrac{1}{2} \cdot (-I^2 - Q^2)\cos\theta \\ &= -\cos\theta \\ &= \sin(\theta - \pi/2) \end{aligned} \tag{11}$$

when $3\pi/4 + 2n\pi < \theta < 5\pi/4 + 2n\pi$ $$\begin{aligned} \theta s &= \tfrac{1}{2} \cdot (-I^2 - Q^2)\sin\theta \\ &= -\sin\theta \\ &= \sin(\theta - \pi) \end{aligned} \tag{12}$$

when $5\pi/4 + 2n\pi < \theta < 7\pi/4 + 2n\pi$ $$\begin{aligned} \theta s &= \tfrac{1}{2} \cdot (I^2 + Q^2)\cos\theta \\ &= -\cos\theta \\ &= \sin(\theta - 3/2 \cdot \pi) \end{aligned} \tag{13}$$

In the case where $\theta s$ is small, we have $$\theta s = \theta v - \theta b \tag{14}$$

Further, in the event that the phase-locked loop 18 is in its synchronous state, the phase difference $\theta_s$ is zero. Therefore, we have $$\theta v = \theta b = \theta i - \theta o \tag{15}$$

As a consequence, the output of the loop filter 24 (denoted by L) is represented by $$\begin{aligned} L &= k \cdot d\theta v/dt = k(d\theta i/dt - d\theta o/dt) \\ &= k(Wi - Wo) \end{aligned} \tag{16}$$

wherein k is a constant. From equation (16) it is clear that the output of the loop filter 24 is proportional to (Wi−Wo)

The output L is applied to the local oscillator controller 30 which has the two threshold levels:

+Rw and −Rw.

If the output L exceeds the upper threshold level (+Rw), the local oscillator controller 30 outputs such a control signal which reduces the frequency difference (Wi−Wo). Therefore, the output frequency of the local oscillator 32 is controlled such that the output L of the loop filter 24 is located between +Rw and −Rw. On the other hand, in the event that the output L does not reach the lower threshold level (−Rw), the controller 30 outputs such a control signal which causes the frequency difference (Wi−Wo) to increase. As a consequence, the frequency of the output of the local oscillator 32 is controlled such that the output L falls within the range defined by ±Rw.

As will be understood, even if the frequency of the IF signal deviates to the extent of causing waveform distortion in the channel filter 20, the frequency of the local oscillator 32 is automatically controlled such that the output of the quasi-coherent demodulator 34 falls within the passband of the channel filter 20.

As referred to in the opening paragraphs of the instant specification, it would be possible for the local oscillator frequency to be equal to the frequency of the incoming IF signal although such a case is rare. In which case, the VCO 26 terminates oscillation if the output of the quasi-coherent demodulator 34 (viz., baseband signal) continues to be applied to the demodulator 16 together with a reproduced carrier from the VCO 26. That is to say, the output of the VCO 26 becomes a direct current signal. Hence, the coherent demodulator 16 no longer functions as a demodulator. In other words, the circuit operates as if the output of the quasi-coherent demodulator 34 is connected to the phase detector 22 via the channel filter 20.

The detailed explanation of a phase detector whose operation is substantially equal to the phase detector 22, is given on pages 222–225 in the book entitled "Phase-lock Techniques" published 1979 by John Wiley & Sons merely by way of example. Further, the demodulator shown in FIG. 9 in a paper published Jun. 7, 1988 by the Institute of Electronics, Information and Communication Engineers (IEICE) (Japan), can be applied to the phase detector 22.

Figure 4:
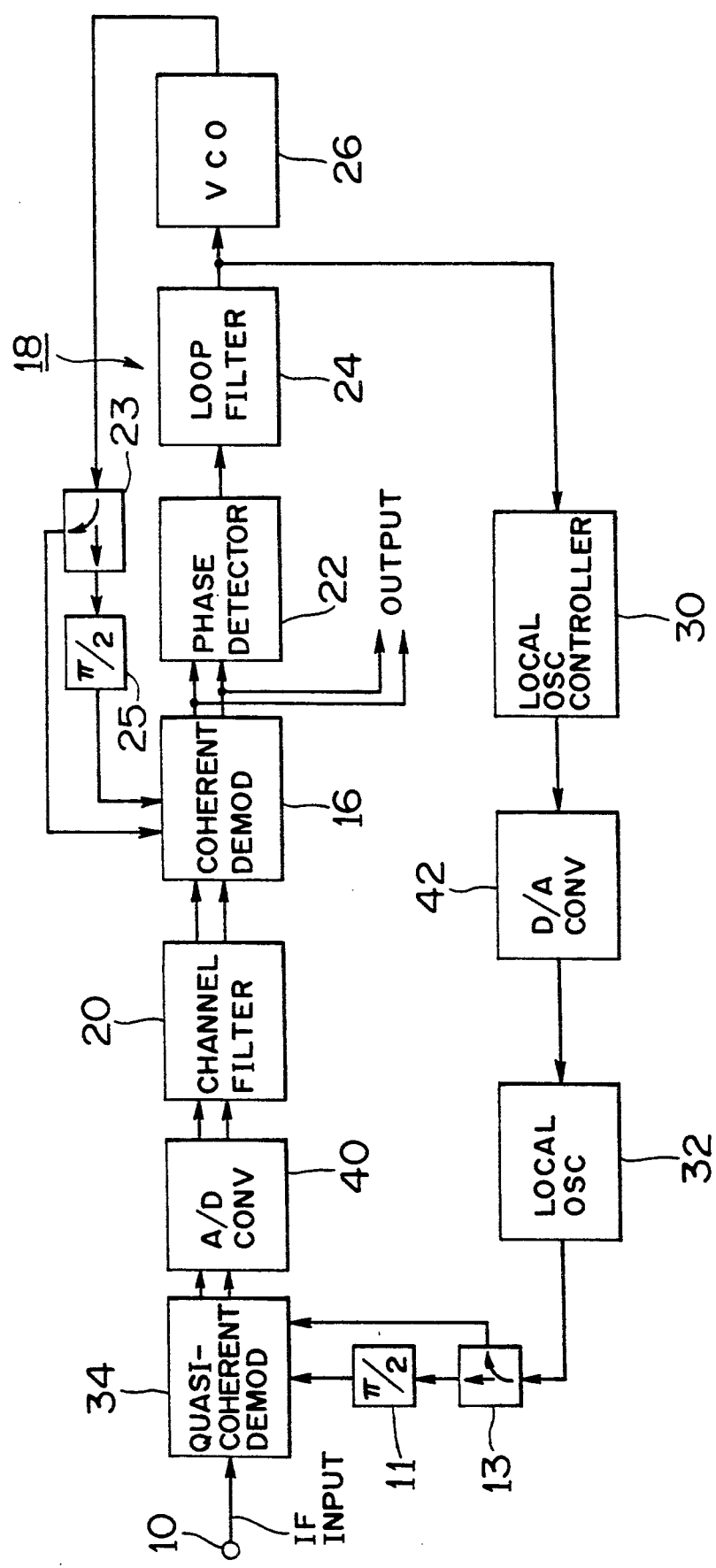
FIG. 4 is a block diagram showing a second embodiment of this invention.

Reference is now made to FIG. 4 wherein a second embodiment of the present invention is shown. This embodiment differs from the first one in that an analog-to-digital (A/D) converter 40 is provided between the quasi-coherent demodulator 34 and the channel filter 20, and in that a digital-to-analog (D/A) converter 42 is provided between the local oscillator controller 30 and the local oscillator 32. The provision of these circuits facilitates the design and production of the demodulating arrangement according to the present invention in IC form.

As will be appreciated by those skilled in the art the function of the second embodiment is essentially the same as the first one and as such no further discussion is deemed necessary.

While the foregoing description describes only two embodiments of the present invention, the various alternatives and modifications possible without departing from the scope of the present invention, which is limited only by the appended claims, will be apparent to those skilled in the art.

What is claimed is:

1. An arrangement for coherently demodulating an incoming IF signal in a digital radio communications system, said arrangement comprising:
    a local oscillator, said local oscillator having a controllable output frequency;
    a quasi-coherent demodulator coupled to receive the incoming IF signal and the output of said local oscillator;
    a channel filter coupled to receive the output of said quasi-coherent demodulator;
    a coherent demodulator coupled to receive the output of said channel filter and a reproduced carrier, said coherent demodulator outputting a baseband signal;
    a phase detector coupled to said coherent demodulator for detecting a phase difference between said baseband signal and said reproduced carrier;
    a loop filter coupled to receive the output of said phase detector;
    a voltage controlled oscillator coupled to receive the output of said loop filter and to generate the reproduced carrier which is applied to said coherent demodulator; and
    a local oscillator controller coupled between said loop filter and said local oscillator.

2. An arrangement as claimed in claim 1, wherein the center frequency of the output of said local oscillator is equal to a nominal frequency of said incoming IF signal.

3. An arrangement as claimed in claim 1, wherein said local oscillator controller controls said local oscillator in a manner that the frequency difference between said incoming IF signal and the output signal of said local oscillator falls within a predetermined range.

4. An arrangement as claimed in claim 2, wherein said local oscillator controller controls said local oscillator in a manner that the frequency difference between said incoming IF signal and the output signal of said local oscillator falls within a predetermined range.

5. An arrangement as claimed in claim 1, further comprising,
    an analog-digital converter provided between said quasi-coherent demodulator and said channel filter; and
    a digital-to-analog converter provided between said local oscillator controller and said local oscillator.

* * * * *